(12) United States Patent
Yamazaki et al.

(10) Patent No.: US 7,495,382 B2
(45) Date of Patent: Feb. 24, 2009

(54) DISPLAY DEVICE HAVING DISPLAY SURFACES WITH POLARIZING PLATES

(75) Inventors: Shunpei Yamazaki, Setagaya (JP); Yoshiharu Hirakata, Kanagawa (JP); Tetsuji Ishitani, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 491 days.

(21) Appl. No.: 10/842,517

(22) Filed: May 11, 2004

(65) Prior Publication Data

US 2004/0227698 A1 Nov. 18, 2004

(30) Foreign Application Priority Data

May 16, 2003 (JP) .............................. 2003-139546
Jun. 30, 2003 (JP) .............................. 2003-188990

(51) Int. Cl.
*H01J 1/62* (2006.01)
(52) U.S. Cl. .................... 313/498; 313/502; 313/504
(58) Field of Classification Search .......... 313/498–512
See application file for complete search history.

(56) References Cited

U.S. PATENT DOCUMENTS

| 5,831,375 | A | 11/1998 | Benson, Jr. |
| 6,774,877 | B2 | 8/2004 | Nishitoba et al. |
| 6,853,421 | B2 | 2/2005 | Sakamoto et al. |
| 6,878,312 | B1 | 4/2005 | Kanbe et al. |
| 7,034,451 | B2 | 4/2006 | Senbonmatsu |
| 2003/0030768 | A1 | 2/2003 | Sakamoto et al. |
| 2003/0062519 | A1 | 4/2003 | Yamazaki et al. |
| 2004/0027513 | A1 | 2/2004 | Yuuki et al. |
| 2004/0070809 | A1* | 4/2004 | Senbonmatsu .............. 359/245 |
| 2005/0024339 | A1 | 2/2005 | Yamazaki et al. |
| 2005/0094067 | A1 | 5/2005 | Sakamoto et al. |

FOREIGN PATENT DOCUMENTS

CN 1192846 9/1998

(Continued)

OTHER PUBLICATIONS

Exhibition of Active Matrix Type Organic EL Display at "13$^{th}$ Flat Panel Display Manufacturing Technology Expo & Conference" by ELDis Group (*in Japanese with full translation*); Jul. 2, 2003.

(Continued)

*Primary Examiner*—Joseph L Williams
(74) *Attorney, Agent, or Firm*—Fish & Richardson P.C.

(57) ABSTRACT

As for the dual emission display device, since light is emitted to the opposite directions from a light emitting element, the both electrodes provided opposite to the light emitting element are transparent/translucent. Accordingly, difficulty in black display is created, and thus, the contrast would be reduced. That results from that the back of the display device can be seen through in black display, that is in the OFF state, since the both electrodes have transparency. Addressing the difficulty in black display with respect to an electronic device and the like including a dual emission display device achieving reduction in the thickness and light weighting, pure black display is performed by providing the dual emission display device part with a polarizing plate or a circularly polarizing plate. Further, the contrast can be improved.

44 Claims, 12 Drawing Sheets

FOREIGN PATENT DOCUMENTS

| | | |
|---|---|---|
| CN | 1397809 | 2/2003 |
| CN | 1402064 | 3/2003 |
| EP | 1 083 775 A1 | 3/2001 |
| EP | 1 284 433 A2 | 2/2003 |
| JP | 2761453 | 6/1998 |
| JP | 3174367 | 6/2001 |
| JP | 2002-040428 | 2/2002 |
| JP | 2003-005710 | 1/2003 |
| JP | 3408154 | 5/2003 |
| JP | 2004-095340 | 3/2004 |
| JP | 2004-205702 | 7/2004 |
| WO | 97/07653 | 2/1997 |
| WO | WO 01/80204 A2 | 10/2001 |
| WO | WO 03/025662 A1 | 3/2003 |
| WO | WO 2004/077386 A1 | 9/2004 |

OTHER PUBLICATIONS

Documents distributed in the "13th Flat Panel Display Manufacturing Technology Expo & Conference" by ELDis Group (5 pages).

"Two-way display developed"; *The Japan Times*; (1 page); Jul. 3, 2003.

"Mass Production of Organic EL Devices"; *Shimotsuke Newspaper* (*in Japanese with full translation*); Jul. 3, 2003.

G. Gu et al.; "Transparent stacked organic light emitting devices. II. Device performance and applications to displays"; *Journal of Applied Physics*, vol. 86, No. 8; pp. 4076-4084; Oct. 15, 1999.

European Patent Office Communication and Search Report (European Application No. 04010839.1) dated May 30, 2005.

Chinese Office Action (Chinese Application No. 200410045614.8), 45 pages, mailed Mar. 28, 2008 with English translation.

* cited by examiner slow axis   transmission axis

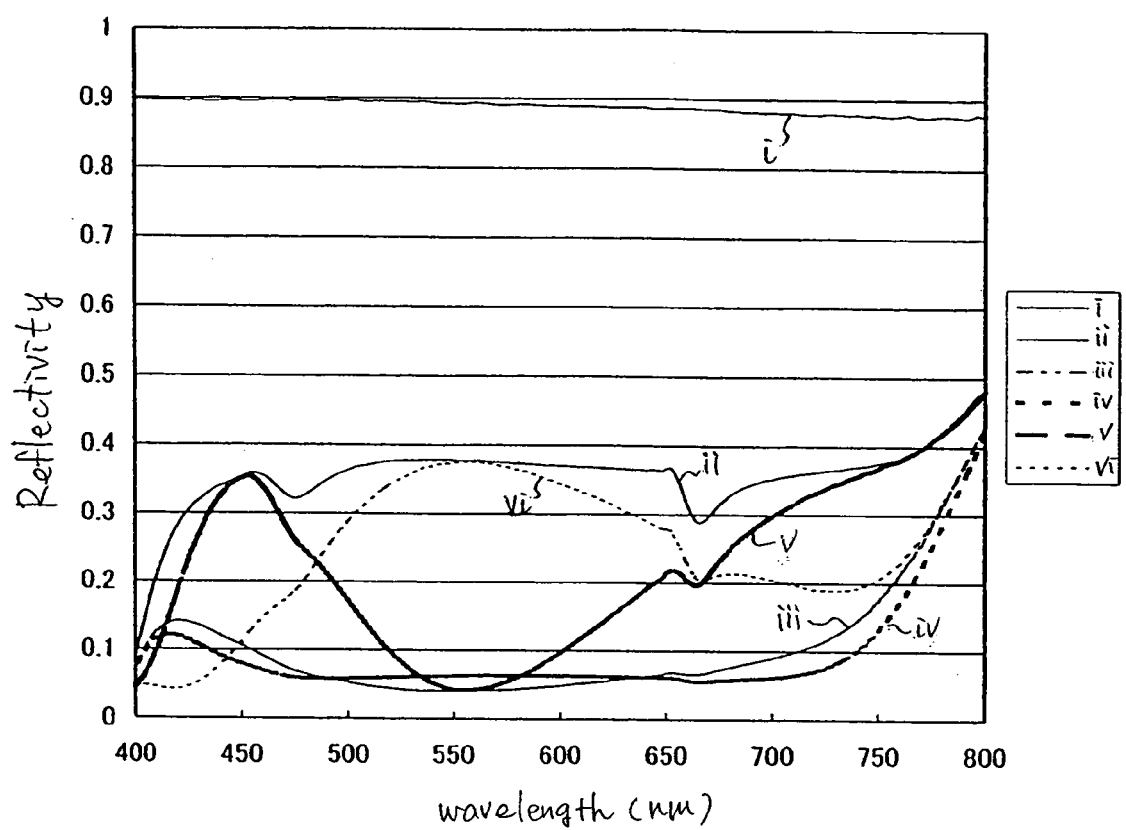

DISPLAY DEVICE HAVING DISPLAY SURFACES WITH POLARIZING PLATES

BACKGROUND OF THE INVENTION

1. Field of the Invention

The present invention relates to a display device having a polarizing plate or a circularly polarizing plate. The present invention particularly relates to a display device in which light emitting elements are arranged in matrix and light is emitted from both sides of the light emitting element.

2. Description of the Related Art

A polarizing plate or a circularly polarizing plate is used for a conventional organic EL panel having an organic EL element (For example, Reference 1: Japanese Patent No. 2761453). Such an optical component is provided since external light is reflected in an electrode formed in a display area and that reduces the visibility of an image. Particularly in a state where no image is displayed, an electrode serves as a mirror surface, and the background could be reflected in the electrode. Further, even in a state where an image is displayed, problems such as reduction in contrast or difficulties in displaying black color could arise.

Laminated wave plates such as a laminate of films giving rise to a phase difference of ½ wavelength, which collectively serves as a half wave plate and a laminate of films giving rise to a phase difference of ¼ wavelength, which collectively serves as a quarter wave plate, and a circularly polarizing plate including such a laminated wave plate are generally used (Reference 2: Japanese Patent No. 3174367).

As an example of an electronic device having an EL element in a display area, a cellular phone can be given. A cellular phone of late years has been enabled to display a main screen and a sub screen by providing a panel having an EL element and a panel having a liquid crystal device, or by providing panels having a liquid crystal device in response to the increasing information and functions.

However, in the case where a main screen and a sub screen is displayed by providing such a plurality of panels as described above, an electronic device has become heavy and thick.

BRIEF SUMMARY OF THE INVENTION

It is an object of the present invention to provide a display device which has a plurality of display surfaces and which further achieves lightweight and thin. Then, problems of a display device having such a new structure will be solved.

A display device in which light is emitted from both sides of a light emitting element (referred to as a dual emission display device) will be provided in view of the above problems. A dual emission display device has a structure technically different from the structure of a cellular phone in which two-screen display is performed by using display areas respectively having light emitting elements stacked together. That is a structure in which light emission from one light emitting element can be recognized from the side that a semiconductor element is provided and also from the opposite side. Thus, an electronic device having a dual emission display device can be made thin and lightweight.

As for the dual emission display device, both electrodes of a light emitting element, which are provided opposite each other, are required to be transparent since light is emitted from both sides of the light emitting element. In consequence, the problem of external light reflection in an electrode described above can be reduced; however, another problem of difficulties in displaying black color (black display) arises. The problem arises since the both electrodes are transparent and in case of black display, in OFF state where no image is displayed, the other side can be seen therethrough. In accordance with the inability in displaying black color, the contrast would also be reduced.

As thus described, another problem in dual emission display device has been arisen. Hence, it is an object of the invention to provide a dual emission display device which can perform pure black display and can achieve high contrast.

A dual emission display device according to the invention has a polarizing plate or a circularly polarizing plate on the emission surfaces. A polarizing plate has a transmission axis and an absorption axis that are at an angle of 90°. Further, transmission axes and absorption axes of polarizing plates are at a 90° angle, and the transmission axes and absorption axes of the polarizing plates may have angular deviations. (hereinafter, angular deviation of either transmission axes and absorption axes is referred to as angular deviation of axes). The acceptable angular deviation is ±45° or less (a range of −45° to +45°), preferably, ±30° or less (a range of −30° to +30°) and further preferably, ±10° or less (a range of −10° to +10°), and still further preferably, ±5° or less (a range of −5° to +5°). Black display that is a state of no light emission can be purely performed and the contrast can be improved by using such polarizing plates.

Next, the angular deviation will be described with reference to FIGS. 4A and 4B. As shown in FIG. 4A, for example, as to absorption axes of polarizing plates, an absorption axis A of a polarizing plate A and an absorption axis B of and polarizing plate B which are at an angle of 90° are called as crossed nicols. Further, transmission axes of the polarizing plate A and absorption axes of the polarizing plate B which are at 90° are also called crossed nicols.

Moreover, the absorption axis A and the absorption axis B which are parallel to each other are called to as parallel nicols. Further, the transmission axis of the polarizing plate A and the transmission axis of the polarizing plate B which are parallel to each other are also called to as parallel nicols.

The angular deviation denotes the deviation from the original angle. For example, as shown in FIG. 4B, deviation from the 90° angle of the crossed nicols, and deviation from the parallel nicols where the absorption axis A and absorption axis B are parallel (0°) to each other. The same is true in using transmission axes. Further, the angular deviation may take a value of plus or minus according to the direction of deviation (rotating direction).

Such a polarizing plate or a circularly polarizing plate is provided on the emission surface in accordance with the structure of the dual emission display device. A polarizing plate and a circularly polarizing plate may be used in combination.

Further, a polarizing plate or a circularly polarizing plate may be provided with an anti-reflective film. For example, anti-glare treatment can be performed by diffusing reflected light in the depression/projection of the surface, thereby reducing reflection. Alternatively, anti-reflection treatment may be performed on a polarizing plate or a circularly polarizing plate by heat-treatment. Thereafter, hard coat treatment may preferably be done for the protection from external shock.

As described above, the problem of black display in a new structure of a dual emission display device in which light is released from both sides of a light emitting element can be solved. In addition, the contrast can be improved

BRIEF DESCRIPTION OF THE DRAWING

FIG. 8 is a graph showing an experimental result on the invention.

DETAILED DESCRIPTION OF THE INVENTION

Embodiment Modes

Figure 1A:
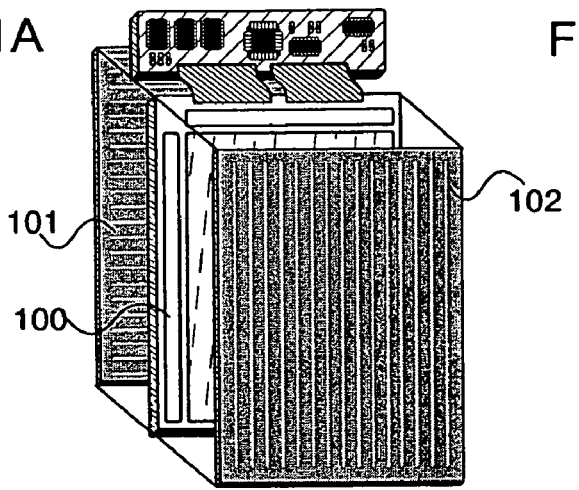
FIGS. 1A to 1D show a dual emission display device according to the invention.

Embodiment modes of the present invention will be described below with reference to the accompanying drawings. Note that in all figures for describing the embodiment modes, the same reference numerals denote the same parts or parts having the same function, and the explanation will not be repeated.

Embodiment Mode 1

In this embodiment mode, a case where a polarizing plate or a circularly polarizing plate is provided in a dual emission display device will be described.

A general view of a dual emission display device is shown FIG. 1A. A first polarizing plate 101 is disposed on a panel 100 of a dual emission display device, and a second polarizing plate 102 is arranged as crossed nicols, that is the axes of the first and the second polarizing plates are at 90° with the first polarizing plate.

Hereupon, the axes of polarizing plates may have angular deviation from crossed nicols configuration, and the angular deviation may be ±45° or less, preferably, ±30° or less, and further preferably, ±10° or less, and still further preferably, ±5° or less. When the angular deviation from crossed nicols configuration is ±45° or less, the transmitted light is reduced by 50% compared with the transmitted light under parallel nicols configuration as is shown in Embodiment 2. Further, in the case where the angular deviation is ±10° or less, the transmitted light is reduced by 90% or more, and further in the case where the angular deviation is ±50 or less, the transmitted light is reduced by 99% or more; and these conditions are suitable for practical use.

Figure 1B:
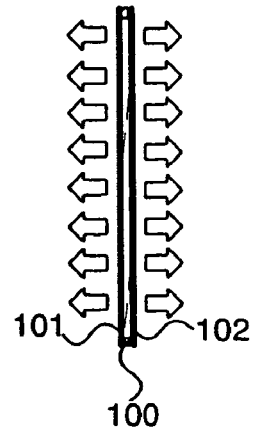

In a panel 100, a display area 103 which is provided with a light emitting element and a semiconductor element, and a driver circuit part 104 are provided; and the driver circuit part 104 is connected to an external circuit 105 via a flexible printed circuit board (FPC), an anisotropic conductive film (ACF), or the like. The external circuit 105 includes a power supply circuit or a controller. As shown in FIG. 1B, such a dual emission display device emits light from both surfaces of the panel having the light emitting element.

Further in the invention, the color emitted from a light emitting element may be monochrome, full color (of RGB toned) For example, full color display or area color display can be performed by using a color filter, or a color filter and a color conversion layer when a white light emitting material is used. Further, full color display or area color display can be performed by using a color conversion layer when a blue light emitting material is used.

Figure 1C:
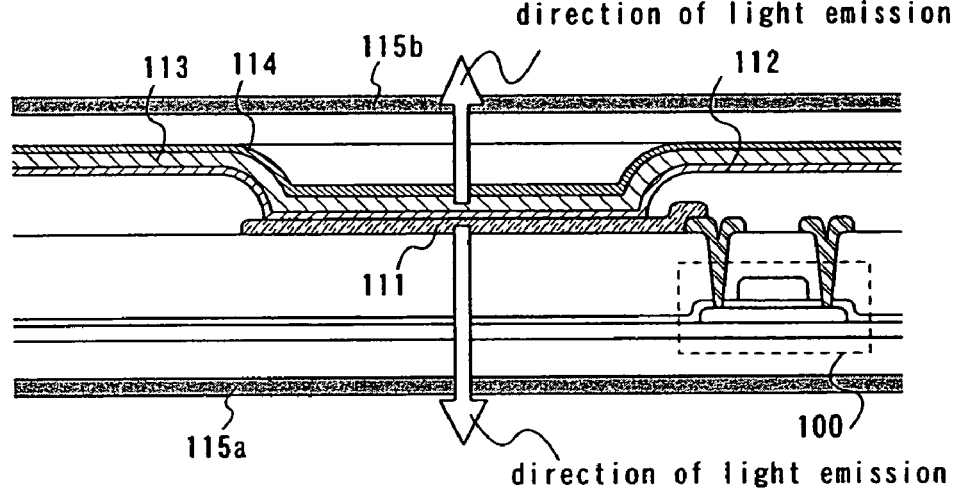

An enlarged cross-sectional view of a panel is shown in FIG. 1C. A driver transistor of this embodiment mode is described by taking the case of using a thin film transistor (TFT) having a polycrystalline silicon film for an example; however, a thin film transistor having an amorphous silicon film, or a MOS transistor having a single crystal may also be applied. Further, the driver TFT here has the conductivity of a p-channel type; however, the driver TFT may also be an n-channel type.

As shown in FIG. 1C, a driver TFT 100 provided over an insulating surface has an impurity region that is formed by adding an impurity element such as boron to a semiconductor film and that is to be source region or drain region. The semiconductor film is crystallized by laser irradiation, heating and/or the use of metal such as nickel. A gate electrode is provided over a channel region of the semiconductor film with a gate insulating film therebetween. A scanning line (not shown) is provided in the same layout as the gate electrode. A first insulating film is provided so as to cover the gate electrode, and a contact hole is formed in the first insulating film over the impurity region. A wiring formed in the contact hole serves as a source wiring or a drain wiring, and a signal line (not shown) is provided in the same layout. A first electrode 111 is provided so as to be electrically connected to the drain electrode. Further, a second insulating film is provided so as to cover the first electrode 111, and an opening is formed over the first electrode. A layer containing an organic compound (hereinafter referred to as an organic compound layer (EL layer)) 112 is provided in the opening, and a second electrode 113 is provided so as to cover the organic compound layer and the second insulating film. Further, an organic material (including a low molecular weight compound or a high molecular weight compound) or a composite material of an organic material and an inorganic material may be used for the organic compound layer.

Further, either a singlet excited state or a triplet excited state can be formed in the organic compound layer. Generally, a ground state is a singlet state, and luminescence from a singlet excited state is referred to as fluorescence. Luminescence from a triplet excited state is referred to as phosphorescence. Luminescence from an organic compound layer includes light emission using either of the excited states. Furthermore, both fluorescence and phosphorescence can be used; thus, either fluorescence or phosphorescence can be selected depending on the luminescence property of each RGB.

Figure 3A:
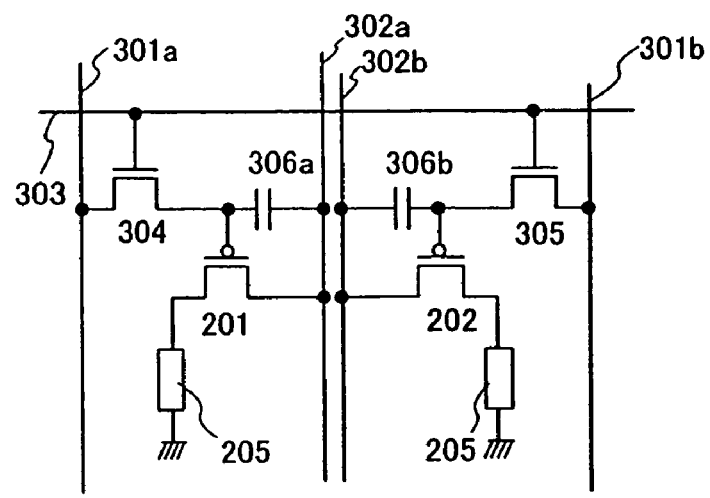
FIGS. 3A to 3C show circuitry of a dual emission display device according to the invention.
Figure 3B:
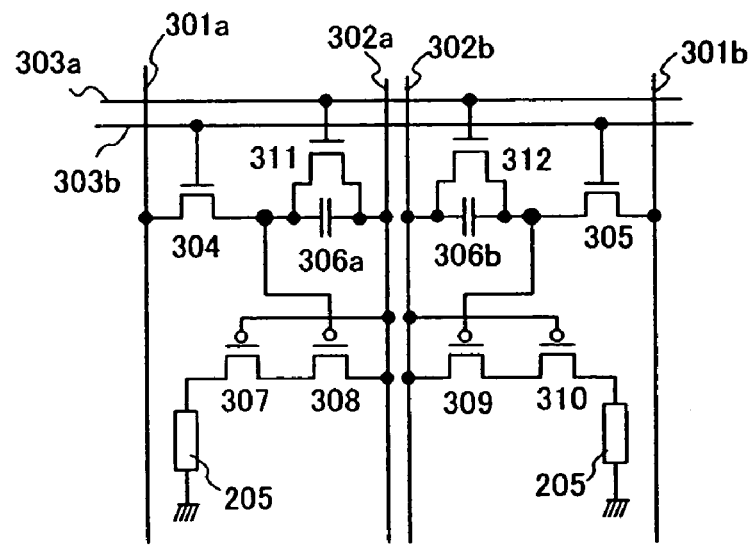

As shown in FIG. 3B, in an organic compound layer 112, an HIL (hole injection layer), an HTL (hole transport layer), an EML (light emitting layer), an ETL (electron transport layer), and an EIL (electron injection layer) are stacked in order from the anode side. Typically, CuPc for an HIL, α-NPD for an HTL, BCP for an ETL, and BCP: Li for an EIL are respectively used, but not limited thereto.

As for the organic compound layer (EL layer) 112, in the case of full color display, specifically, a material layer producing luminescence of red (R), green (G), and blue (B) may be deposited appropriately and selectively by vapor deposition with the use of respective deposition masks or by ink-jet. Specifically, CuPc or PEDOT for an HIL, α-NPD for HTL, BCP or Alq$_3$ for an ETL, BCP:Li or CaF$_2$ for an EIL, are used respectively. For example, Alq$_3$ doped with each dopant corresponding to each luminous color of R, G, or B (DCM or the like for R, DMQD or the like for G) may be used for the EML. Note that the organic compound layer is not limited to the above structure.

As for a more specific layered structure of an organic compound layer, in the case where the organic compound layer 112 that emits red light is formed, for example, after 30 nm thick CuPc and 60 nm thick α-NPD are formed, Alq$_3$ doped with DCM$_2$ and rubrene is deposited to be 40 nm thickness as a red light emitting layer; BCP is deposited to be 40 nm thickness as an electron transport layer; and BCP doped with Li is deposited to be 1 nm thickness as an electron injection layer by using one and the same mask. When an organic compound layer 112 that emits green light is formed, after 60 nm thick α-NPD is formed, Alq$_3$ doped with coumarin 545T is deposited as a green light emitting layer to be 40 nm in thickness, BCP is deposited as an electron transport layer to be 40 nm in thickness, and then BCP doped with Li is deposited as an electron injection layer to be 1 nm in thickness by using the same deposition mask. When the organic compound layer 112 that emits blue light is formed, for example, after 30 nm thick CuPc and 60 nm thick α-NPD are formed, bis[2-(2-hydroxyphenyl)benzoxazolate]zinc: Zn (PBO)$_2$ is deposited to be 10 nm thickness, 40 nm thick BCP is deposited as an electron transport layer, and 1 nm thick BCP doped with Li is deposited as an electron injection layer by using one and the same mask, thereby forming a light emitting layer.

In the above organic compound layers, CuPc and α-NPD common to pixels can be formed over the entire surface of the pixel area. Further, a mask can be shared by respective colors, for example, a red organic compound layer, a green organic compound layer, and a blue organic compound layer can be formed by suitably sliding a single mask. Note that the forming order of an organic compound layers can be decided appropriately.

In the case of white light emission, full color display may be performed by separately providing a color filter or a color filter and a color conversion layer. A color filter or a color conversion layer may be provided on the second substrate, and may be pasted to the substrate thereafter. Further, a color filter or a color conversion layer for white light that is emitted downward may be formed. Furthermore, a dual emission display device in which one surface gives full color display and the other gives monochromatic display can be acquired.

A passivation film containing nitrogen 114 is formed by sputtering or CVD, thereby preventing moisture and oxygen penetration. Space created hereat may be filled with nitrogen and sealed, and a desiccant may be disposed inside the space. Further, the side surfaces of the display area may be covered by the first electrode, the second electrode, and other electrode. Thereafter, a sealing substrate is pasted to the substrate, and a first polarizing plate 115a and a second polarizing plate 115b are respectively provided for the substrate and the sealing substrate.

As for a dual emission display device as thus fabricated according to the invention, the first electrode 111 and the second electrode 113 are transparent/translucent. Accordingly, the light is emitted from the light emitting layer to the first display surface through the first electrode 111, and the light is emitted from the light emitting layer to the second display surface through the second electrode 113. In other words, luminescence from the light emitting element is released through the substrate side where the driver TFT is provided and also released through the sealing substrate side opposed to the substrate side (see the arrow showing the direction of the light emission).

In addition, the dual emission display device emits light by disposing the first and the second polarizing plate as crossed nicols, and black display is performed in the part except the displaying area, so that the background can not be seen through even when viewing from either side. Pure black display is enabled and contrast can be improved accordingly by the invention using polarizing plates for a dual emission display device.

Figure 1D:
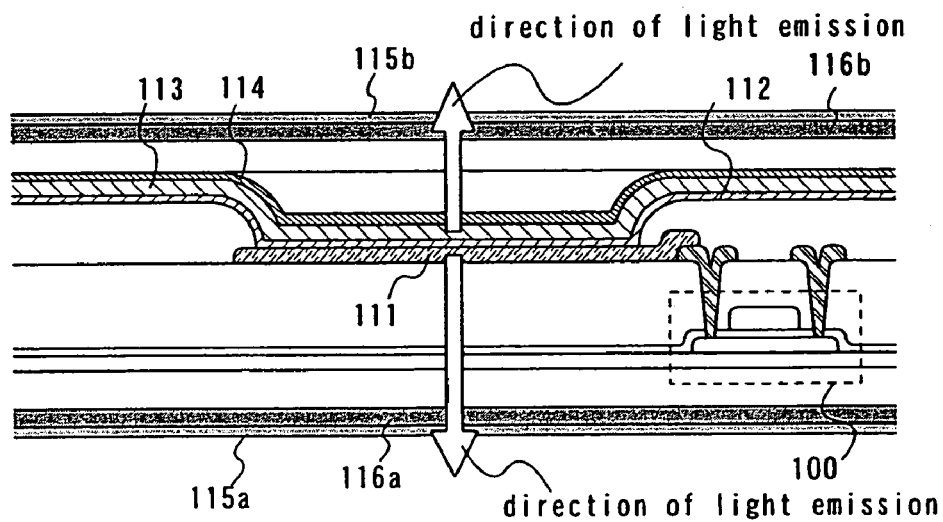

In addition, a circularly polarizing plate may be used for the dual emission display device as shown in FIG. 1D. A circularly polarizing plate has axes of a slow axis and a fast axis; however, a slow axis is used in this embodiment mode. In addition, an absorption axis is used as an axis of a polarizing plate. For example, the first polarizing plate 115a and the first wave plate 116a are stacked, and the second polarizing plate 115b and the second wave plate 116b are stacked, thus respectively providing a first and a second circularly polarizing plates. The first and the second wave plate may be either a pair of quarter-wave plates, a pair of half-wave plates, or a combination of the both wave plates stacked together.

In Embodiment 1 below, an experimental result showing prominent effect of using a polarizing plate in comparison with a circularly polarizing plate will be shown.

In addition, the result of using combinations of wave plates is shown in Embodiment 1. It is found that a combination of a quarter-wave plate and a half-wave plate stacked together, or the pair of quarter-wave plates is suitable for the first and the second wave plate.

Figure 11A:
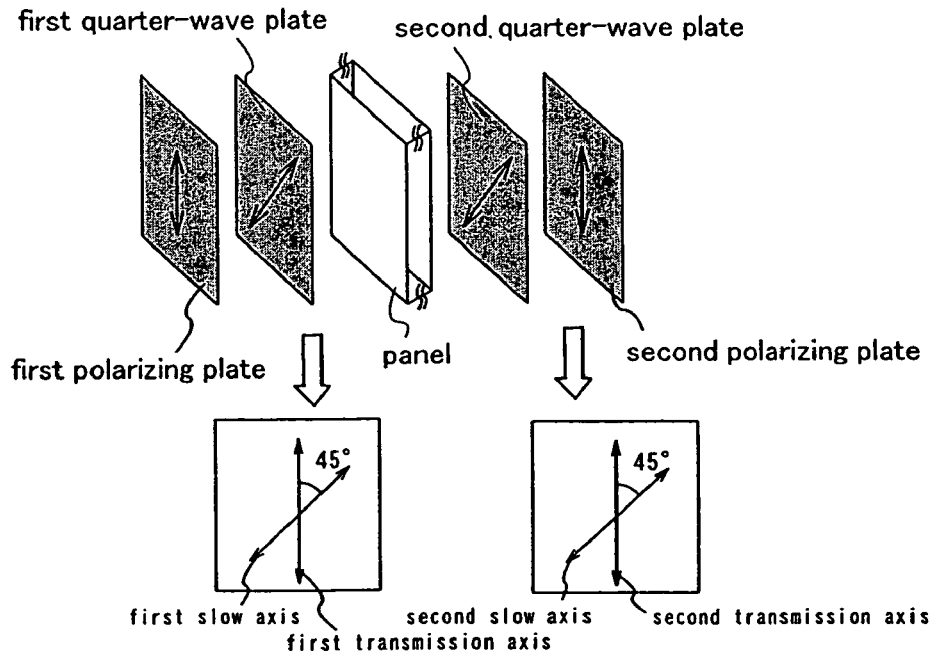
FIGS. 11A and 11B show a placement of a circularly polarizing plate according to the invention.

In particular, as Condition ii shown in Embodiment 1, a transmission axis (a first transmission axis) of the first polarizing plate and a slow axis (a first slow axis) of the first quarter-wave plate, and a transmission axis (a second transmission axis) of the second polarizing plate and a slow axis (a second slow axis) of the second quarter-wave plate are each arranged at a 45° angle; the first and the second transmission axes are arranged in parallel that is as parallel nicols; and the first and the second slow axes are arranged in parallel (FIG. 11A). Further, the first and the second absorption axes may be arranged perpendicularly, that is, as crossed nicols, and the first and the second slow axes may be arranged perpendicularly. In other words, the first slow axis is at a 45° angle to the first transmission axis, and the slow axis of the second quarter-wave plate is at a 90° angle to the first slow axis and the transmission axes of the polarizing plate is arranged as crossed nicols. In such structures, a polarizing In other words, a polarizing plate, a quarter-wave plate, a panel (a light emitting element), a quarter-wave plate, and a polarizing plate are arranged in sequence.

Figure 11B:
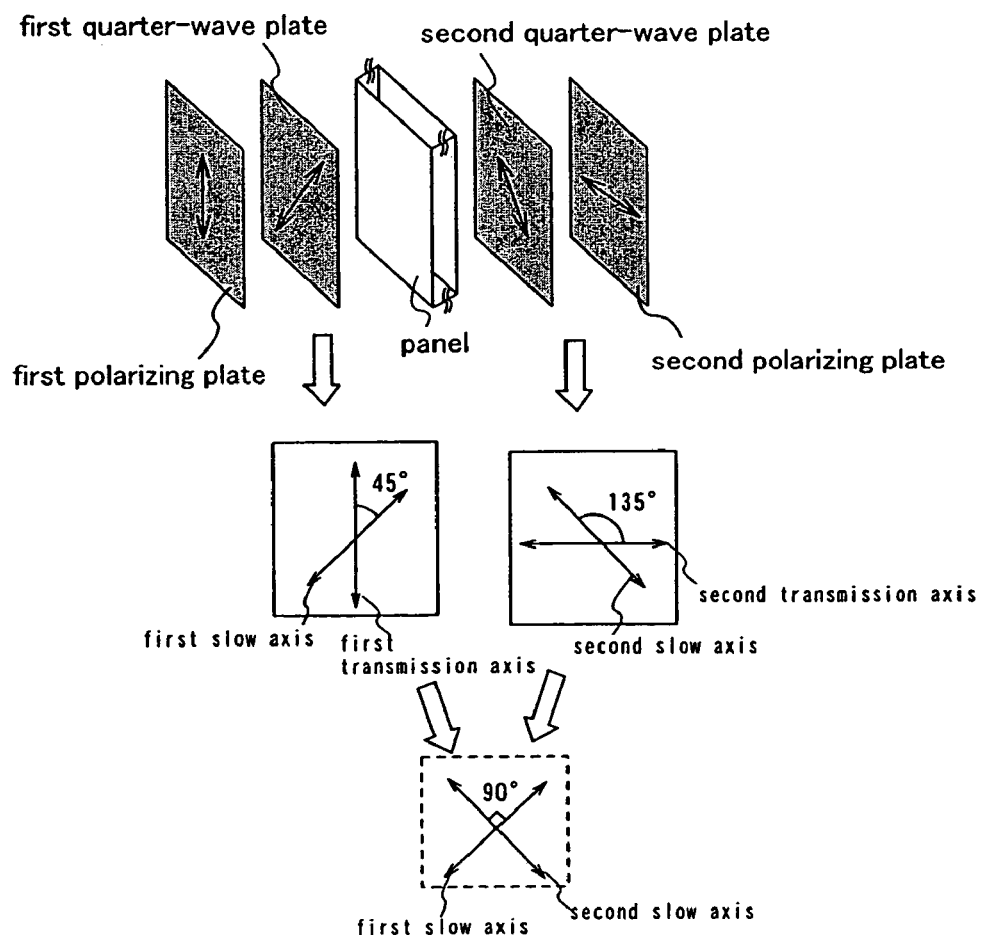
Figure 12:
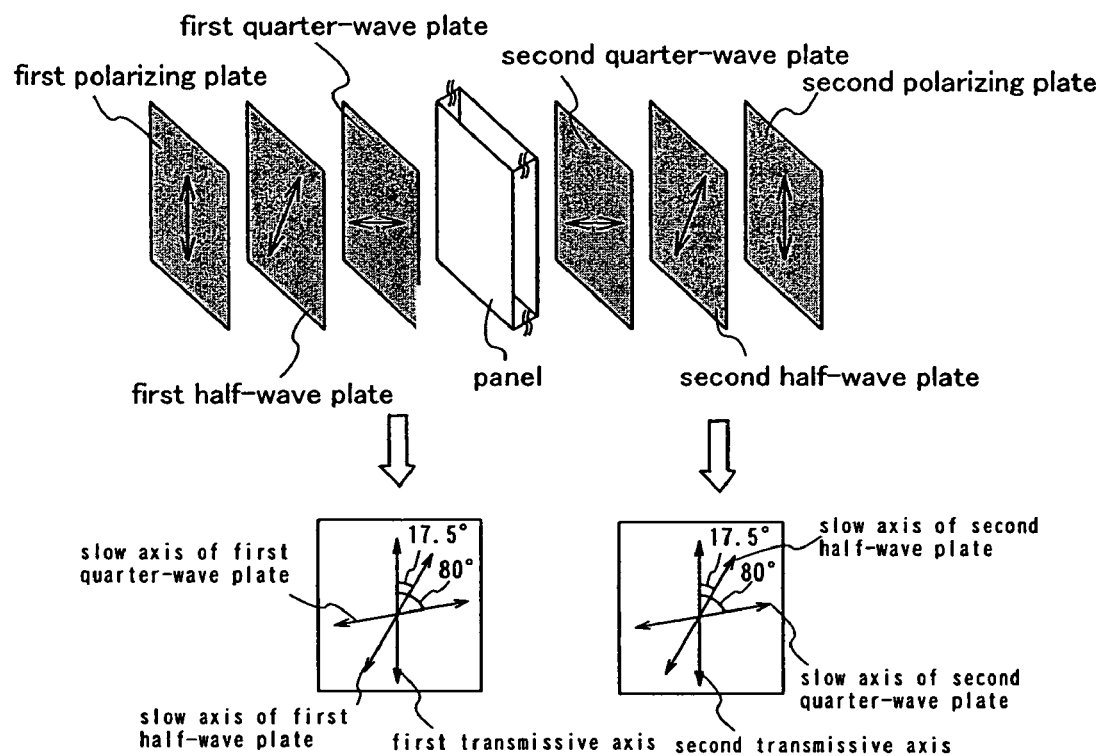
FIG. 12 shows a placement of a circularly polarizing plate according to the present invention.

Further, referring to Condition iv shown in Embodiment 1, the transmission axis of the first polarizing plate (a first transmission axis) and the slow axis of the first half-wave plate, and the transmission axis of the second polarizing plate (the second transmission axis) and the slow axis of the second half-wave plate are respectively arranged at a 17.5° angle. The first transmission axis and the first slow axis of the quarter-wave plate, and the second transmission axis and the second slow axes of a quarter-wave plate are respectively arranged at a 80° angle, where the first and the second transmission axes arranged in parallel, that is as parallel nicols, and slow axes of the first and the second half-wave plates and the first and the second slow axes of the quarter-wave plates are arranged in parallel (FIG. 12). The slow axis of the first quarter-wave plate and the slow axis of the second quarter-wave plate may be arranged at a 90° angle as in FIG. 11B. In such structures, a polarizing plate, a half-wave plate, a quarter-wave plate, a panel (a light emitting element), a quarter-wave plate, a half-wave plate, and a polarizing plate are arranged in sequence.

In addition, according to Embodiment 3, a circularly polarizing plate has a high effect of preventing an reflected light compared with a polarizing plate. Accordingly, when reflection from an electrode or a wiring of a light emitting element that is reflection of external light becomes problems, a circularly polarizing plate described above may be provided preferably.

As thus described, in the invention, a polarizing plate, a circularly polarizing plate, or a combination thereof can be provided depending on the structure of the dual emission display device. Consequently, pure black display can be performed, and the contrast can be improved. Further, reflecting light can be prevented by providing a circularly polarizing plate.

Embodiment Mode 2

In this embodiment mode, a structure of a dual emission display device different from that of FIGS. 1A to 1D in the case where a circularly polarizing plate or a polarizing plate is provided will be described.

As for the dual emission display device different from the one in FIG. 1C, light is emitted from the second electrode side in a first area, and light is emitted from the first electrode side in a second area. Accordingly, a plurality of light emitting elements and a plurality of driver TFTs are provided in one pixel; the first electrode electrically connected to the first light emitting element is opaque and the second electrode opposed to the first electrode is transparent. The first electrode electrically connected to the second light emitting element is transparent, and the second electrode opposed to the first electrode is opaque. A film containing metal or colored resin may be formed on the transparent/translucent electrode so as to obtain opacity.

In this case, black display can be performed purely since an opaque material is provided. However, particularly when the metal material having high reflectivity is used for an opaque electrode, reflection of external light can cause troubles. Therefore, a circularly polarizing plate rather than a polarizing plate may preferably be provided. A quarter-wave plate, a half-wave plate, or a laminate thereof can be provided as a wave plate of the circularly polarizing plate. In a circularly polarizing plates provided in the first area and the second area may have different wave plates.

Figure 2A:
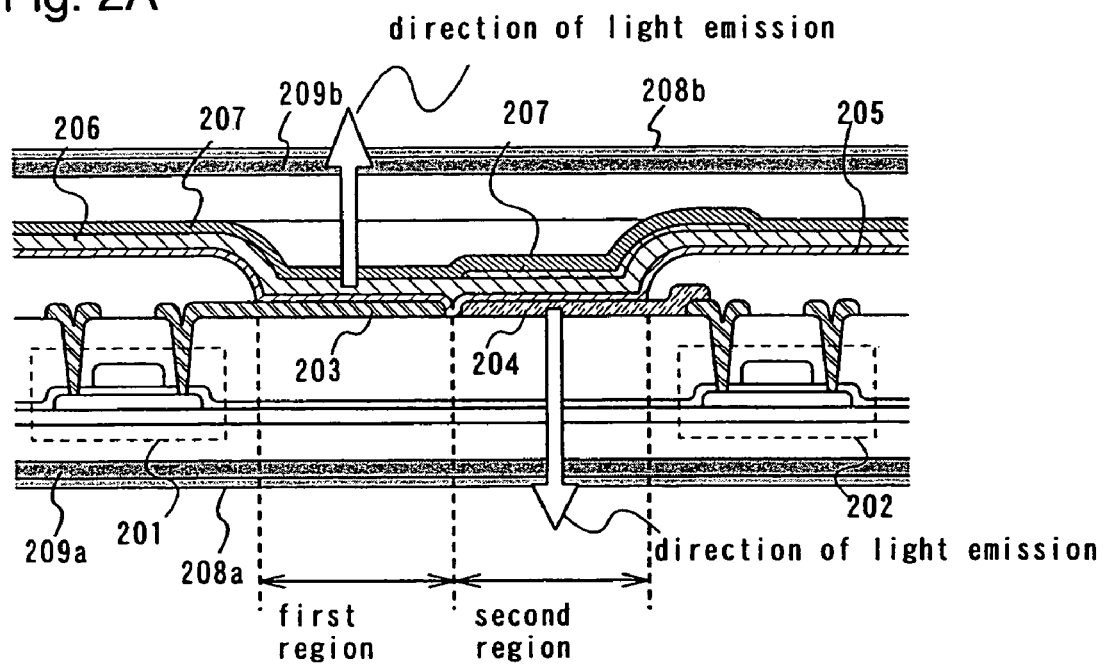
FIGS. 2A and 2B shows a dual emission display device according to the invention.

An enlarged view of a panel section is shown in FIG. 2A. A first driver TFT 201, and a first electrode 203 containing an opaque material and being connected to the first driver TFT 201 are provided in the first area. A second driver TFT 202, and a second electrode 204 containing a transparent material and being connected to the second driver TFT 202 are provided in the second area.

An organic compound layer 205 including a light emitting layer is provided over the first electrode 203 and the second electrode 204; a third electrode 206 is provided over the light emitting layer, and a film 207 containing an opaque material is further provided over the third electrode 206 in the second area. A metal material such as aluminum or titanium is used for the first electrode 203 that is opaque or for the film 207 provided on the second electrode 204. The second transparent electrode 204 and the third electrode 206 can use materials such as ITO. In particular, a stack of a first metal layer containing titanium, a second metal layer containing titanium nitride or nitride tungsten, a third metal layer containing aluminum, and a fourth metal layer containing titanium nitride may be preferably used for the second electrode 204 connecting to the semiconductor film.

A passivation film containing nitrogen 207 is formed by sputtering or CVD, thereby preventing moisture and oxygen penetration. Space made hereat may be filled with nitrogen and sealed, and a desiccant may be disposed inside the space. Further, the side surfaces of the display area may be covered by the first electrode, the second electrode, and other electrodes. Thereafter, a sealing substrate is pasted to the substrate, and a first polarizing plate 208a and a first wave plate 209a, and a second polarizing plate 208b and a second wave plate 209b are respectively provided as a first and a second circularly polarizing plates.

The first and the second wave plates may be either a pair of quarter-wave plates, a pair of half-wave plates, or a combination of both wave plates stacked together. A circularly polarizing plate has axes of a slow axis and a fast axis; however, a slow axis is used in this embodiment mode. In addition, an absorption axis is used as an axis of a polarizing plate.

For example, when quarter-wave plates are respectively used for the first and the second wave plates according to Embodiment 1, it is preferable that absorption axes of the first and second polarizing plates (which may be replaced by transmission axes) (first and second absorption axes) and slow axes of the first and second quarter-wave plates (first and second slow axes) be respectively arranged at a 45° angle. Further, a first polarizing plate of a first circularly polarizing plate and a second polarizing plate of a second circularly polarizing plate are arranged as parallel nicols, in other words, an absorption axis of the first polarizing plate and an absorption axis of the second polarizing plate may be preferably arranged in parallel (0°), and the first and the second slow axes may be arranged so as to be parallel to each other. In this embodiment mode, arrangements of circularly polarizing plates shown in FIGS. 11A and 11B may be combined and the detailed arrangement is shown in FIGS. 11A and 11B. Further, the arrangements of circularly polarizing plates respectively using a quarter-wave plate and a half-wave plate for the first and the second wave plates shown in FIG. 12 may be combined in this embodiment mode.

As still another combination, a quarter-wave plate is used for a wave plate of the first circularly polarizing plate, and a laminate of a half-wave plate and a quarter-wave plate can be used for a wave plate of the second circularly polarizing plate. It is preferable that a slow axis of the first half-wave plate and an absorption axis (which may be replaced by a transmission axis) of the first polarizing plate (a first absorption axis) may be arranged at a 17.5° angle, and a slow axis of the first quarter-wave plate may be arranged at an angle of 2×(17.5)+45=80° with the absorption axis of the first polarizing plate. Here, as to the second circularly polarizing plate, the slow axis of the second quarter-wave plate should be arranged at a 80° angle with absorption axis of the second polarizing plate (a second absorption axis). The absorption axis of the first polarizing plate of the first circularly polarizing plate may be arranged at a 215° angle with the absorption axis of the second polarizing plate of the second circularly polarizing plate.

The axes of the polarizing plates may have angular deviation. The angular deviation may be ±45° or less, preferably, ±30° or less, and further preferably, ±10° or less, and still further preferably, ±5° or less.

Current flows between the first electrode 203 or the second electrode 204, and the third electrode 206, and is light emitted from the organic compound layer 205. Then, since the first electrode 203 containing a metal material reflects light and the electrode 206 transmits light, light is emitted in the direction of the third electrode in the first area, and light is emitted to the side of the second electrode in the second area.

In this embodiment mode, a case of providing a plurality of driver TFTs is described; however, a driver TFT can be shared by a light emitting element in the first area and a light emitting element in the second area by a driving method and a wiring connection. Further, such an organic compound layer described in Embodiment Mode 1 may be used in this embodiment mode.

Figure 2B:
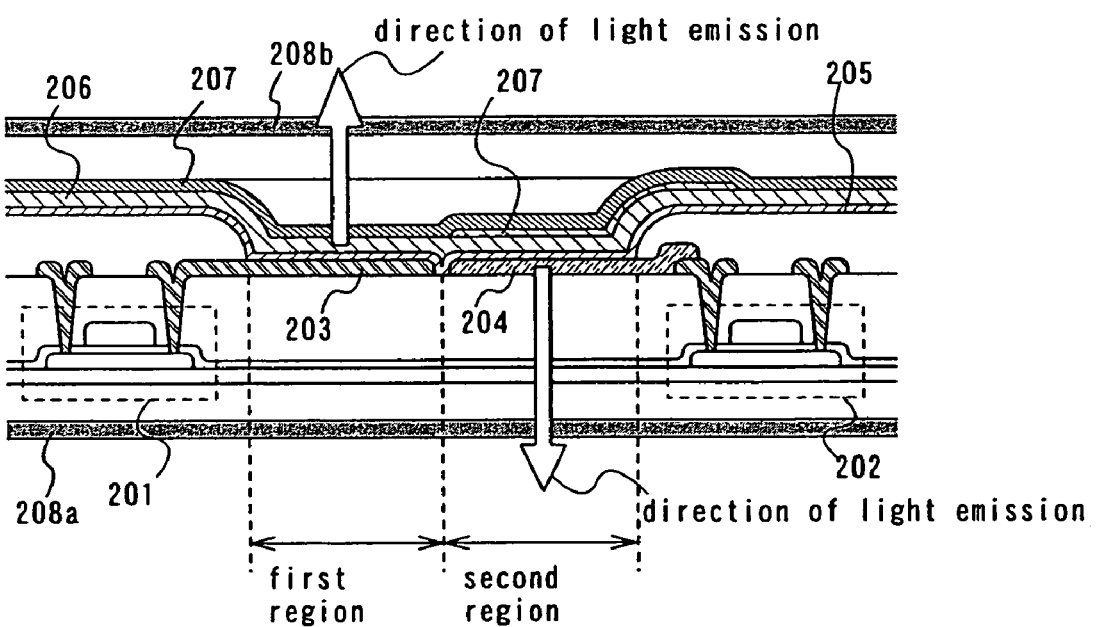

In FIG. 2B, a structure in which polarizing plates are provided instead of circularly polarizing plates and a first polarizing plate 208a and a second polarizing plate 208b are provided is shown. The polarizing plates may be provided considering the area and size of an opaque first electrode in the first area, the area of an opaque third electrode in the second area, and usages of display in the first area and the second area.

In FIG. 3, the circuitry of one pixel in FIG. 2 is shown. It is shown that the organic compound layer 205 (which is shown as a light emitting element in the circuit diagram) is each arranged in one pixel in a pixel circuit. However, a light emitting layer can be shared by the first area and the second area as is apparent from the cross-sectional view.

A pixel circuit shown in FIG. 3A has switching TFTs 304 and 305 which are respectively connected to a first signal line 301a and a second signal line 301b, and are connected to a scanning line 303. The pixel circuit further includes current supply lines 302a and 302b which are respectively connected to the switching TFTs 304 and 305 via capacitor elements 306a and 306b. The capacitor elements 306a and 306b have the function of keeping the gate-to-source voltage of respective driver TFTs 201 and 202. However, a gate capacity of the driver TFTs 201 and 202 can be used as a substitute, the capacitor elements 306a and 306b may not necessarily be provided. The driver TFTs 201 and 202 are each connected to the light emitting element 205 via the first electrode.

In such a pixel circuit, it is possible to perform display only in the first area with the second area OFF by separately providing current supply lines. Further, different displays can be performed in the first area and the second area.

For example, in the case where different displays are performed, when a scanning line 303 is selected, video signals of respective displays are input by a first signal line 301a and a second signal line 301b. In addition, a predetermined charge is kept in the capacitor elements 306a and 306b, and when the driver TFTs 201 and 202 are turned ON, a current is supplied to the light emitting element, and it emits light.

When one area, for example, the first area is to be off, voltage that makes voltage input by a signal line be relatively zero may be input to the current supply line 302a so that charge is not stored in the capacitor element 306a.

In FIG. 3A, a schematic diagram in which the scanning line 303 is shared by the switching TFTs 304 and 305, and the switching TFTs 304 and 305 are respectively connected to the signal lines 301a and 301b is shown; however, the signal line can be shared by providing a scanning line for each switching TFT.

The current supply line can also be shared, and in that case, the same displays are performed in the first area and the second area.

An erasing TFT may be provided at opposite ends of the capacitor elements 306a and 306b, so that time division grayscale display is performed.

Subsequently, a pixel circuit shown in FIG. 3B has a current control TFTs 308 and 309 controlling current supply to the light emitting element 205, as well as driver TFTs 307 and 310.

The driver TFTs 307 and 310 and the current control TFTs 308 and 309 have the same conductivity. The driver TFTs 307 and 310 shall be depletion mode transistor, and the rest of the transistors shall be normal enhancement mode transistors. In the invention, the driver TFTs 307 and 310 are operated in a saturation region and the current control TFTs 308 and 309 are operated in a linear region. The gate length (L) of the driver TFTs 307 and 310 may be longer than the gate width (W), and the L of the current control TFTs 308 and 309 may be equal to or less than the W. Desirably, the ratio of L to W (L/W) of the driver TFTs 307 and 310 is five or more.

Next, a driving method of the pixel shown in FIG. 3B will be described. The operation of the pixel shown in FIG. 3B can be divided into a writing period and a storage period. First, in the writing period, when the scan line 303b is selected, the switching TFTs 304 and 305 whose gates are connected to the scan line 303b are turned ON. Then, a video signal which is inputted to the signal lines 301a and 301b is inputted to the gates of the current control TFTs 308 and 309 via the switching TFTs 304 and 305. The driver TFTs 307 and 310 are ON at all times as the gates are connected to the current supply lines 302a and 302b.

When the current control TFTs 308 and 309 are turned ON by a video signal, current is supplied to the light emitting element 205 via the current supply lines 302a and 302b. At this time, the current control TFTs 308 and 309 operate in a linear region, thus current flowing in the light emitting element 205 is determined by volt-ampere characteristics of the light emitting element 205 and the driver TFTs 307 and 310 operating in a saturation region. The light emitting element 205 emits light at the luminance corresponding to the magnitude of the supplied current.

Meanwhile, when the current control TFTs 308 and 309 are turned OFF by a video signal, no current is supplied to the light emitting element 205, thus it does not emit light. It is to be noted that according to the invention, it is possible to control current so as not to be supplied to the light emitting element 205 even when the driver TFTs 307 and 310 are depletion mode transistors since the current control TFTs 308 and 309 are enhancement mode transistors.

In the storage period, the switching TFTs 304 and 305 are turned OFF by controlling a potential of the scan line 303b, thereby storing a potential of the video signal that is written in the writing period. In the writing period, when the current control TFTs 308 and 309 is turned ON, a potential of a video signal is stored in the capacitors 306a and 306b, therefore, the current supply to the light emitting element 205 is kept on. On the contrary, when the current control TFTs 308 and 309 is turned OFF in the writing period, a potential of a video signal is stored in the capacitors 306a and 306b, therefore, current is not supplied to the light emitting element 205.

When time division grayscale display is performed, the erasing period can be provided by erasing TFTs 311 and 312 are and an erasing scan line 303a connected to the erasing TFTs, and thus preferable for high level scale display.

Figure 3C:
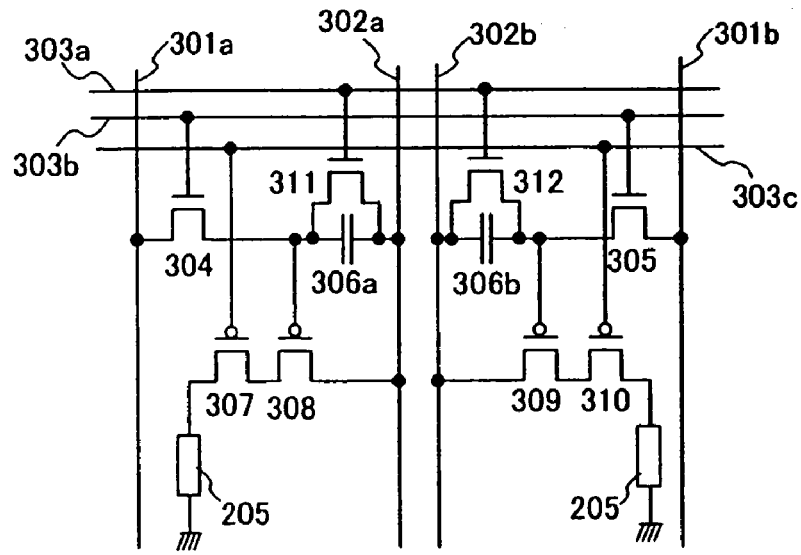
Figure 4A:
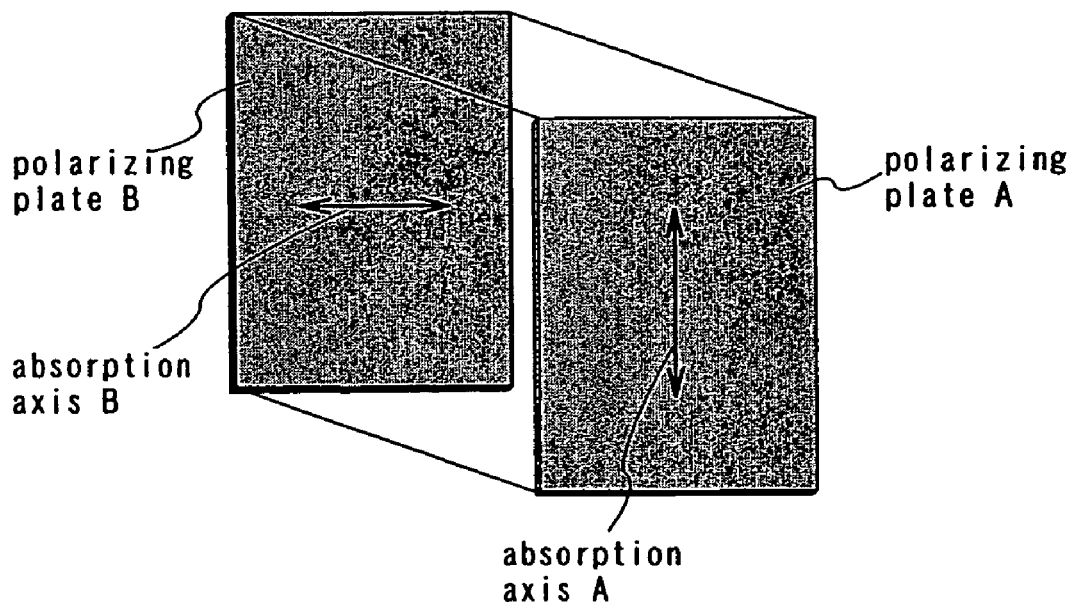
FIGS. 4A and 4B show a placement of a polarizing plate according to the present invention.
Figure 4B:
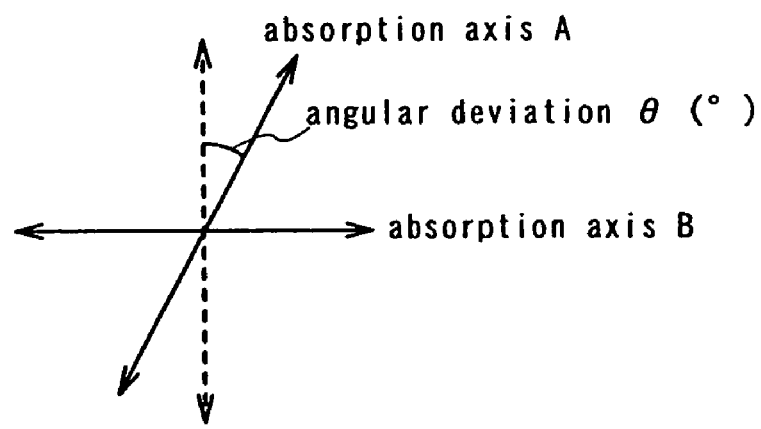

Further, in FIG. 3C, a pixel circuit in which the driver TFTs 307 and 310 are connected to a second scan line 303c is shown. The pixel circuit has the same structure as the one shown in FIG. 3B except that gate electrodes of the driver TFTs 307 and 310 are connected to the scan line 303c that is newly provided. Accordingly, the detailed explanation will be omitted.

First, in the writing period, when the scan line 303b is selected, the switching TFTs 304 and 305 whose gates are connected to the scan line 303b are turned ON. Then, a video signal which is inputted to the signal lines 301a and 301b is inputted to the gates of the current control TFTs 308 and 309 via the switching TFTs 304 and 305. At the same time, the potential of the video signal is kept in the capacitor elements 306a and 306b.

In the lighting period, when the second scan line 303c is selected, the driver TFTs 307 and 310 whose gates are connected to the second scan line are turned ON. Hereupon, when the current control TFTs 308 and 309 are turned ON by the potential of a video signal kept in the capacitor elements 306a and 307b, current is supplied to the light emitting element 205 via the current supply lines 302a and 302b. At this time, the current control TFTs 308 and 309 operate in a linear region, thus current flowing in the light emitting element 205 is determined by volt-ampere characteristics of the light emitting element 205 and the driver TFTs 307 and 310 operating in a saturation region. The light emitting element 205 emits light at the luminance corresponding to the magnitude of the supplied current.

Meanwhile, when the current control TFTs 308 and 309 are turned OFF by the potential of a video signal kept in the capacitor elements 306a and 307b, no current is supplied to the light emitting element 205, thus it does not emit light. In the non-lighting period, the switching TFTs 304 and 305 are turned OFF by the second scan line 303c. Therefore, current is not supplied to the light emitting element 205.

Note that the second scan line 303c may either be selected or not be selected in the non-lighting period.

When time ratio grayscale display is performed, erasing period can be provided by erasing TFTs 311 and 312 are and an erasing scan line 303a connected to the erasing TFTs, and thus preferable for high level gradation display.

As thus described, various display can be done by using a pixel structure according to the invention.

Pure black display can be performed by providing circularly polarizing plates or polarizing plates to make the transmittance lowest, and thus, reflected light can be reduced. Consequently, the contrast can be improved.

Embodiment Mode 3

A dual emission display device of the invention can be used as one display area. However, in this embodiment mode, a case where (a double-sided display panel) is used as a part of a display area of an electronic device will be described. In particular, when a dual emission display device (a double-sided display panel) is provided over a flexible substrate such as a plastic substrate, the thickness of a chassis is controlled, and the flexibility can be improved.

Figure 9A:
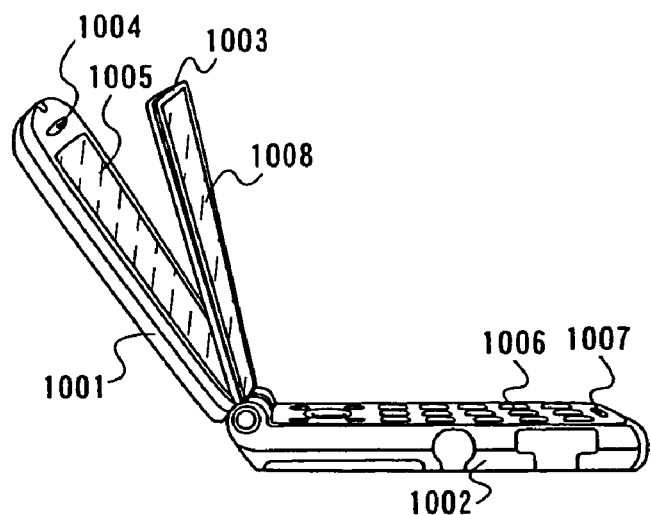
FIGS. 9A to 9C show an electronic device having a dual emission display device according to the invention.

First, an example of providing a double-sided display panel 1003 using a dual emission display device of the invention for a folding cellular phone is shown in FIG. 9A. The folding cellular phone has a first chassis 1001, a second chassis 1002, and a double-sided display panel 1003. The first chassis 1001 has an audio output part 1004 and a first display area 1005. The second chassis 1002 has an operation button 1006, a voice input part 1007. The double-sided display panel 1003 has a first display surface 1008 and a second display surface. A cellular phone according to the invention has a structure in which the double-sided display panel 1003 is sandwiched between the first chassis 1001 and the second chassis 1002.

Figure 9B:
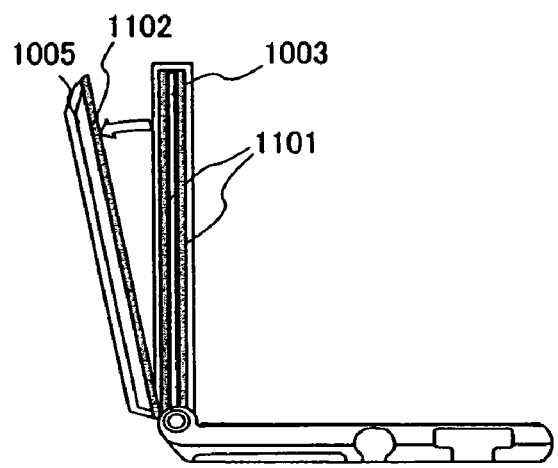

As shown in FIG. 9B, when the first chassis 1001 is stacked over the double-sided display panel 1003, the first display surface 1008 of double-sided display panel 1003, namely, only one display surface is used as a screen. A dual emission display device as described in Embodiment Mode 1 or 2 can be used for the dual emission panel. Polarizing plate 1101 is provided in this embodiment mode. The first display area 1005 can use a display panel including a light emitting element or a liquid crystal device, and in this embodiment mode, a circularly polarizing plate 1102 is provided for the display panel having a light emitting element.

Figure 9C:
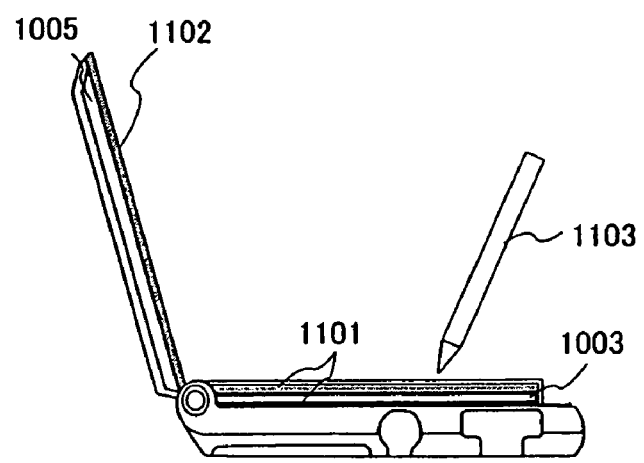

Further, as shown in FIG. 9C, when the second chassis 1002 is stacked over the double-sided display panel 1003, the second display surface and the first display area 1005 of the double-sided display panel 1003, namely, two surfaces can be used as screens. Further, the dual emission panel can be used as a data input unit and input can be done by means of a touch pen 1103.

FIG. 3A show an example of providing a dual emission display device 413 for a notebook computer, and a first chassis 4105 has a first display area 4101, a second chassis 4106 has an operation button 4104, etc, and the double-sided display panel 4103 has a first display surface 4102 and a second display surface. The double-sided display panel 4103 is sandwiched between the first chassis 4105 and the second chassis 4106.

In normal use, one surface serves as a display, and the double-sided display panel 4103 is superimposed on the first chassis. Alternatively, the first display area 4101 may be displayed superimposing the double-sided display device on the first chassis 4105 with the first display surface 4102 OFF. Further, when a large screen is required, display is performed on two screens by using the first display area 4101 and the second display surface where the double-sided display panel is stacked over the second chassis.

Figure 10A:
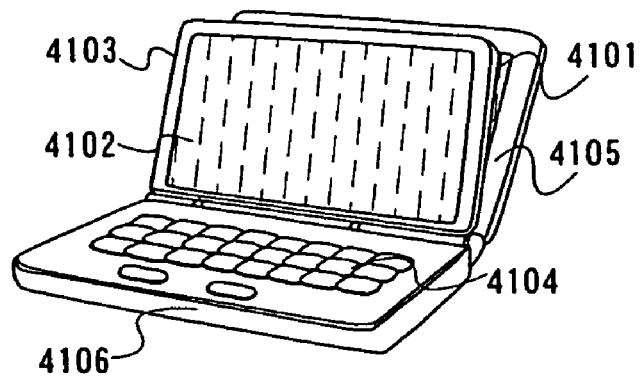
FIGS. 10A to 10C show an electronic device having a dual emission display device according to the invention.
Figure 10B:
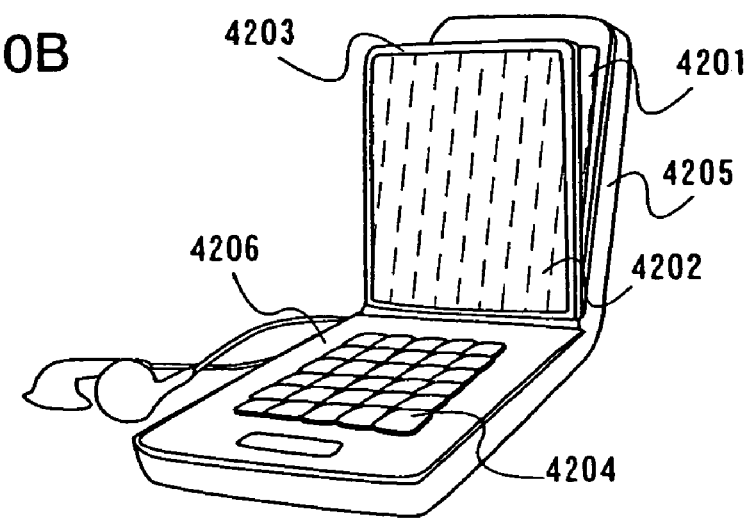

FIG. 10B shows an example of providing a double-sided display panel 4203 for a PDA. The first chassis 4205 has a first display area 4201, a second chassis 4206 has an operation button 4204, and a double-sided display panel 4203 has a first display surface 4202 and a second display surface. The double-sided display panel 4203 is sandwiched between the first chassis 4205 and the second chassis 4206.

In normal use, one surface serves as a display, and the double-sided display panel 4203 is superimposed on the first chassis. Alternatively, the first display area 4201 may be displayed superimposing the double-sided display device on the first chassis 4205 with the first display surface 4202 OFF. Further, when a large screen is required, display is performed on two screens by using the first display area 401 and the second display surface where the double-sided display panel is stacked over the second chassis.

Figure 10C:
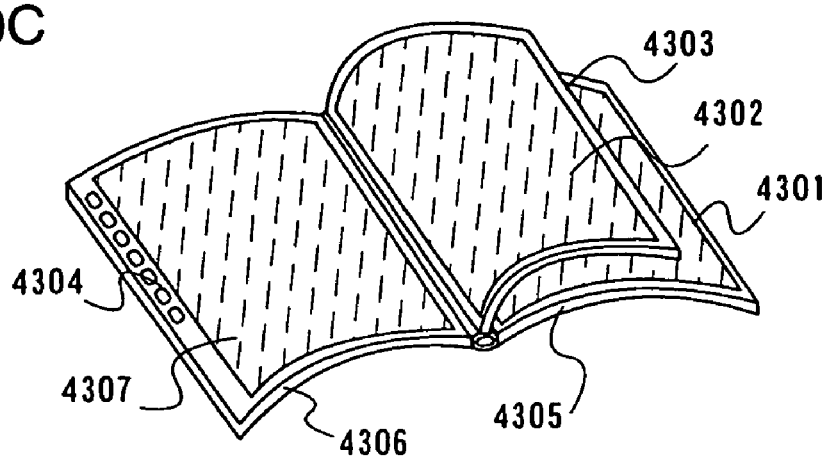

FIG. 10C shows an example of providing a double-sided display panel 4303 for an electronic book. A first chassis 4305 has a first display area 4301, a second chassis 4306 has an operation button 4304 and a second display area 4307, and a double-sided display panel 4303 has a first display surface and a second display surface 4302. The double-sided display panel 4303 is sandwiched between the first chassis and the second chassis.

For an example of usage of the electronic book in which the double-sided display panel 4303 is interposed, it is convenient to read a text on the first display area 4301 and the second display surface 4302, and to see a figure on the second display area 4307 and the first display surface. Since the double-sided display panel 4303 cannot display the first display surface and the second display surface 4302 at the same time, display of the first display surface shall be switched to the display of the second display surface when turning the page.

Further, after what is on the first display surface to the first display area 4301 is read, and the next page, the second display surface and the second display area display the next page when turning the next page, the double-sided display panel at a certain angle. In addition, after what is on the second display surface 4302 and the second display area 4307 is read, the first display surface and the first display area 4301 display the next page at a certain angle when the double-sided display panel is turned up. Thus, the switching of displays is made invisible, and visual sense of incongruity can be reduced. Desirably, the dual emission panel may be provided over a flexible substrate, thereby further reducing the sense of incongruity.

Embodiments

Embodiment 1

In this embodiment, the transmittance in the case of using a combination of a polarizing plate and a wave plate using a metal halide lamp IMH-250 (manufactured by SIGMA KOKI) for a light source is evaluated.

The placement conditions of a polarizing plate or a wave plate (also referred to as a retardation film, and one producing a quarter wavelength retardation and another producing a half wavelength retardation are used) are as follows. The placement conditions include the order from a light source, and angles formed between a transmission axis of a polarizing plate and a slow axis of a wave plate.

i. Polarizing plate A/Polarizing plate B
ii. Polarizing plate A/Quarter-wave plate (45°)/Polarizing plate B
iii. Polarizing plate A Half-wave plate (45°)/Half-wave plate (45°)/Polarizing plate B
iv. Polarizing plate A/quarter-wave plate (80°)/Quarter-wave plate (80°)/Half-wave plate (17.5°)/Polarizing plate B The total phase of the wave plates is 1 λ in Conditions iii and iv.

Figure 5A:
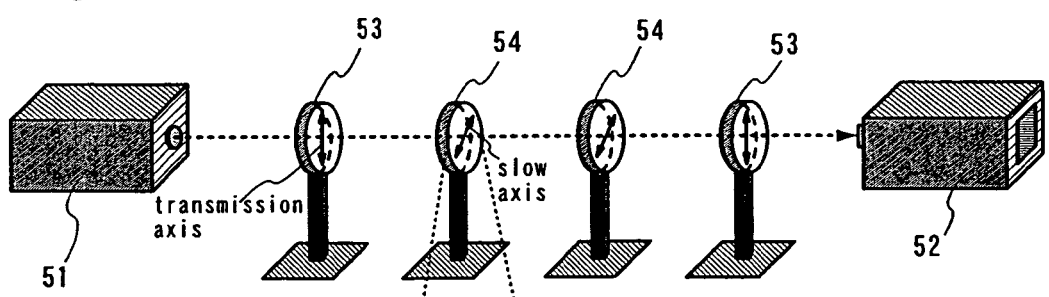
FIGS. 5A and 5B show an experiment on the invention.
Figure 5B:
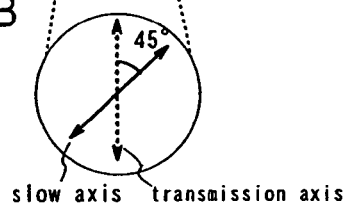

A system of measurement under Condition ii is shown in FIG. 5A. A polarizing plate (Pol) 53 and a quarter-wave plate 54 are provided between a light source 51 and a transmittance measuring instrument BM5A (a photoreceiver) 52 so that a slow axis of the quarter-wave plate is arranged at a 45° angle with a transmission axis of the polarizing plate (FIG. 5B).

In Table 1, the values of the maximum and the minimum of the intensity of transmitted light (cd/m$^2$) and the standard value (the minimum/the maximum) under placement conditions i to iv are shown.

TABLE 1

| condition | maximum | minimum | standard value (minimum/maximum) |
|---|---|---|---|
| i | 526.8(0°) | 0.352(90°) | 7.E−04 |
| ii | 397(90°) | 15(0°) | 3.E−02 |
| iii | 375.2(0°) | 36.37(90°) | 9.E−02 |
| iv | 374.5(305°) | 7.49(215°) | 2.E−02 |

It is found in Table 1 that the combination of only polarizing plates provides the minimal light spillage, and preferable black level can be obtained. Among combinations including a wave plate, black level under Condition iv is the highest; however, the black level is lower compared with the combination of only polarizing plates. Incidentally, the lowest black level in this experiment was shown when two half-wave plates are used under Condition iii.

When a wave plate is used, the quality of black display is worsened since the light having a wavelength other than the center wavelength of the wave plate becomes elliptically polarized light or the like, and thus, the deviation from the absorption axis of a polarizing plate is produced. Further, even light having a wavelength of the center wavelength may cause such deviation due to the incidence angle to the wave plate. As for Condition iii, that is an arrangement including half wave plates, the elliptical component is increased and more deviation is caused than in an arrangement including a quarter-wave plate. Further, as for Condition iv, that includes a combination of a half-wave plate and a quarter-wave plate, the deviation can be reduced by arranging the wave plates so as to cover wide band range. Specifically, the deviation can be reduced approximately to a half of the arrangement of Condition ii including quarter-wave plates and to a quarter of the arrangement of Condition iii including half-wave plates. However, all the elliptically polarized light can not be suppressed. Therefore, the black display in the case of using a structure including is degraded compared with the structure which has only polarizing plates.

As a consequence, as for a dual emission display device in which the reflection in the electrode portion is a little, the combination of only polarizing plates can improve the quality of black display and is thought to be advantageous in improving the contrast.

In the case where the dual emission display device has a structure as in Embodiment Mode 2, a circularly polarizing plate can be used as described above.

Embodiment 2

Angular dependency of polarizing plates A and B arranged as Condition i is measured in this embodiment. The result is shown below.

First, polarizing plates A and B are arranged at a 90° angle as crossed nicols. The relation between transmitted light and the deviated angle of the axis of the polarizing plate A from the crossed nicols is shown by using a measurement system in FIG. 5A. Further, in Table 2, intensity of the transmitted light is normalized by the value of crossed nicols. Thus, the normalized intensity is equivalent to the transmittance. The absorption axis is used as the axis of the polarizing plate here.

TABLE 2

| angle (°) | intensity (normalized) | angle (°) | intensity (normalized) |
|---|---|---|---|
| 0 | 0.000668185 | 0 | 0.000662273 |
| 5 | 0.005187927 | −5 | 0.012926457 |
| 10 | 0.025873197 | −10 | 0.040802292 |
| 15 | 0.065451784 | −15 | 0.087277937 |
| 20 | 0.118033409 | −20 | 0.140687679 |
| 25 | 0.183921792 | −25 | 0.214708691 |
| 30 | 0.233295368 | −30 | 0.262082139 |
| 40 | 0.392179195 | −35 | 0.344794651 |
| 45 | 0.47911921 | −40 | 0.430563515 |
| 50 | 0.576689446 | −45 | 0.519579752 |
| 60 | 0.731017464 | −50 | 0.601337154 |
| 70 | 0.871298405 | −60 | 0.757402101 |
| 80 | 0.958807897 | −70 | 0.89321872 |
| 90 | 1 | −80 | 0.977459408 |
|  |  | −90 | 1 |

Figure 7:
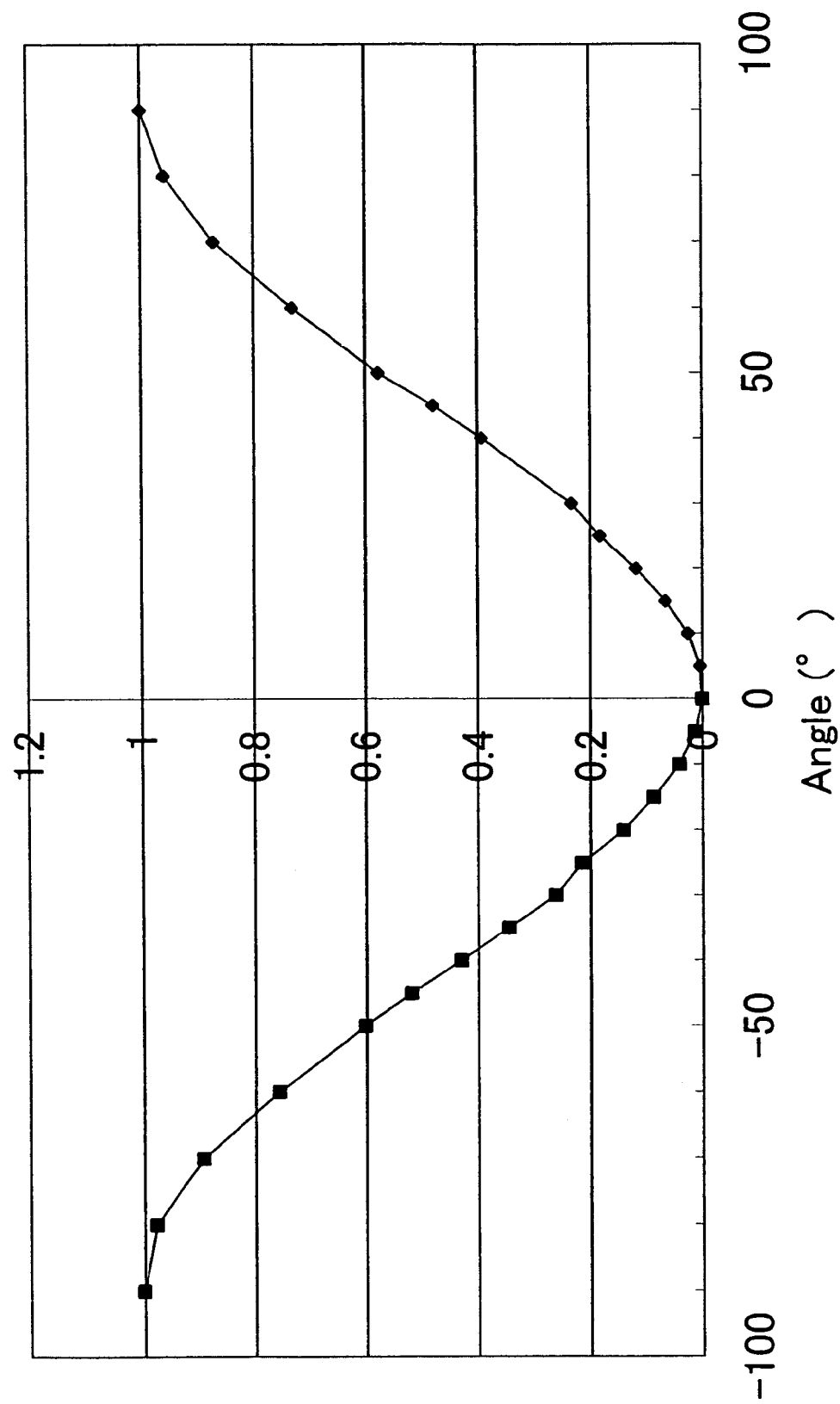
FIG. 7 is a graph showing an experimental result on the invention.

A graph based on table 2 is shown in FIG. 7.

Consequently, an acceptable angular deviation between the polarizing plates A and B is considered ±45° or less where the intensity is reduced by 50%, preferably, ±30° or less where the intensity is reduced by 30%, and further preferably, ±10° or less where the intensity is reduced by 99%, and still further preferably, ±5° or less.

Note that, in this experiment, a metal halide lamp is used for a light source and a panel actually including a light emitting element is not used. Accordingly, when the luminance of a light emitting element is high, the acceptable range of the angular deviation is broadened and enough contrast is considered to be obtained enough.

In this embodiment, an experiment for evaluating the intensity of light reflecting light using a polarizing plate or various circularly polarizing plates by using a metal halide lamp IMH-250 (manufactured by SIGMA KOKI) for a light source is performed. With this experiment, the amount of reflection of external light that can be reduced by a polarizing plate or various circularly polarizing plates can be evaluated.

First, Samples made under the conditions shown below are prepared.

i. glass substrate/metal film
ii. glass substrate/metal film/polarizing plate
iii. glass substrate/metal film/quarter-wave plate (45°)/polarizing plate
iv. glass substrate/metal film/quarter-wave plate (80°)/half-wave plate (17.5°)/polarizing plate
v. glass substrate/metal film/a quarter-wave plate (45°)/half-wave plate (45°)/polarizing plate
vi. glass substrate/metal film/half-wave plate (45°)+polarizing plate In this experiment, a metal film, a 1000 Å Al—Ti film is formed by sputtering.

Embodiment 3

Figure 6:
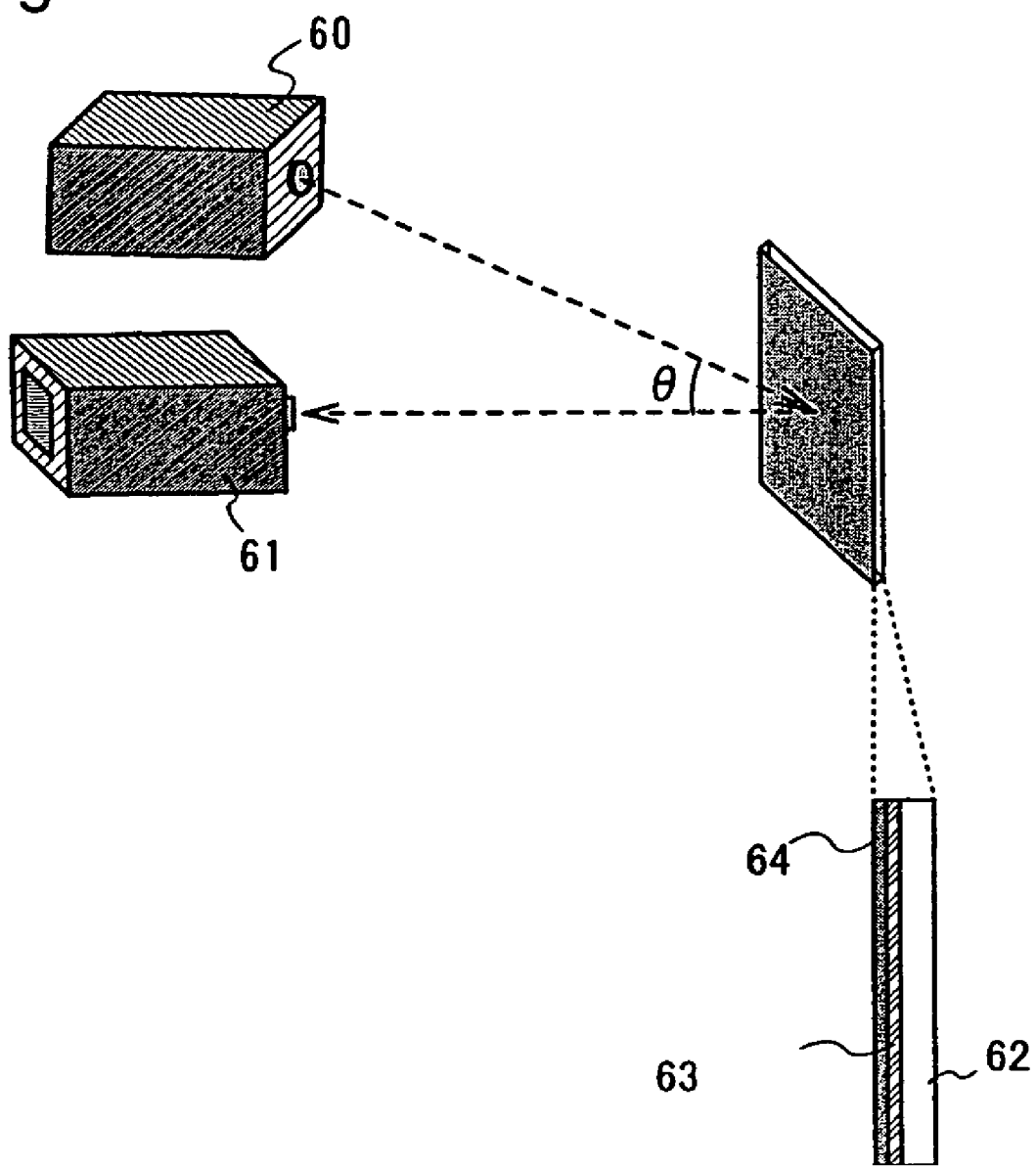
FIG. 6 shows an experiment on the invention

A system of measurement used for Sample iii is shown in FIG. 6A. The intensity of reflected light (cd/m$^2$) is measured under the following conditions: a metal film 63 is formed over a glass plate 62; light is emitted from a light source 60 and entered into the sample including a circularly polarizing plate or a polarizing plate 64 at an angle of θ=30°; and a luminance meter BM-5A (a light receiving element, manufactured by TOPCON) 61 is arranged perpendicular to the sample.

The experimental result of Samples i to vi is shown in Table 3.

TABLE 3

| sample | intensity of reflected light (cd/m$^2$) |
|---|---|
| i | 28 |
| ii | 13 |
| iii | 5.4 |
| iv | 5 |
| v | 5.8 |
| vi | 20 |

As Table 3 shows, Samples iii, iv, and v show high anti-reflective effect.

The reflected light in Samples i to vi is measured in the wave length range of 400 nm to 800 nm by a recording spectrophotometer U4000 (manufactured by Hitachi, Lid.). The result is shown in FIG. 8.

As FIG. 8 shows, in Sample iii and iv, preferable low reflectivity can be obtained in a large area. Further, as compared to Table 3, it is found that the reflected light can be considerably prevented when a polarizing plate or a wave plate is provided.

As above Embodiments 1 to 3 show, a polarizing plate or various circularly polarizing plates may be used appropriately depending on the application.

According to the invention, light emission from one light emitting element can be recognized from the side where a semiconductor element is provided and from the opposite side. Accordingly, the thickness of an electronic device having a dual emission display device can be reduced, and light weighting can be achieved. The invention is to settle the difficulties in black display in a dual emission display device. Pure black display is performed, and the contrast can be improved by using a polarizing plate or a circularly polarizing plate is.

What is claimed is:

1. A display device comprising:
a light emitting layer provided between a first electrode and a second electrode;
wherein the light emitting layer emits light to a first display surface though the first electrode, and to a second display surface through the second electrode,
wherein the first and the second display surfaces are provided with a first polarizing plate and a second polarizing plate, respectively,
wherein the first polarizing plate and the second polarizing plate are arranged as crossed nicols, and
wherein angular deviation from the crossed nicols is ±45° or less.

2. A display device according to claim 1, wherein the angular deviation is ±30° or less.

3. A display device according to claim 1, wherein the angular deviation is ±10° or less.

4. A display device according to claim 1, wherein the angular deviation is ±5° or less.

5. A display device according to claim 1, wherein the first electrode and the second electrode contain ITO.

6. A display device comprising:
a light emitting layer provided between a first electrode and a second electrode;
wherein the light emitting layer emits light to a first display surface through the first electrode, and to a second display surface through the second electrode,
wherein the first and the second display surfaces are provided with a first polarizing plate and a second polarizing plate, respectively,
wherein an axis of the first polarizing plate and an axis of the second polarizing plate are at an angle of 90°, and
wherein angular deviation from the crossed nicols is ±45° or less.

7. A display device according to claim 6, wherein the angular deviation is ±30° or less.

8. A display device according to claim 6, wherein the angular deviation is ±10° or less.

9. A display device according to claim 6, wherein the angular deviation is ±5° or less.

10. A display device according to claim 6, wherein the first electrode and the second electrode contain ITO.

11. A display device comprising:
a light emitting layer provided between a first electrode and a second electrode;
wherein the light emitting layer emits light to a first display surface through the first electrode, and to a second display surface through the second electrode,
wherein the first and the second display surfaces are provided with a first circularly polarizing plate and a second circularly polarizing plate, respectively.

12. A display device according to claim 11,
wherein the first circularly polarizing plate and the second circularly polarizing plate respectively have a first quarter-wave plate and a second quarter-wave plate,
wherein an absorption axis of the first polarizing plate and a slow axis of the first quarter-wave plate in the first circularly polarizing plate are at 45°,
wherein an absorption axis of the second polarizing plate and a slow axis of the second quarter-wave plate included in the second circularly polarizing plate are at 45°, and
wherein an absorption axis of the first polarizing plate and an absorption axis of the second polarizing plate, and a slow axis of a first quarter-wave plate of and a slow axis of a second quarter-wave plate are respectively parallel to each other.

13. A display device according to claim 11,
wherein the first circularly polarizing plate and the second circularly polarizing plate respectively have a first quarter-wave plate and a second quarter-wave plate,
wherein an absorption axis of the first polarizing plate and a slow axis of the first quarter-wave plate in the first circularly polarizing plate are at 45°,
wherein an absorption axis of the second polarizing plate and a slow axis of the second quarter-wave plate included in the second circularly polarizing plate are at 45°, and
wherein an absorption axis of the first polarizing plate and an absorption axis of the second polarizing plate, and a slow axis of a first quarter-wave plate and a slow axis of a second quarter-wave plate are respectively at 90°.

14. A display device according to claim 11,
wherein the first circularly polarizing plate has a first quarter-wave plate and a first half-wave plate, and the second circularly polarizing plate has second quarter-wave plate and a second half-wave plate,
wherein an absorption axis of a first polarizing plate and a slow axis of the first half-wave plate included in the first the circularly polarizing plate are at 17.5°,
wherein an absorption axis of the first polarizing plate and a slow axis of the first quarter-wave plate are at 80°,
wherein an absorption axis of a second polarizing plate and a slow axis of the second half-wave plate of included in the circularly polarizing plate are at 17.5°,
wherein an absorption axis of the second polarizing plate and a slow axis of the second quarter-wave plate are at 80°, and
wherein an absorption axis of the first polarizing plate and an absorption axis of the second polarizing plate, and a slow axis of the first quarter-wave plate and a slow axis of the second quarter-wave plate are respectively parallel to each other.

15. A display device according to claim 11, wherein the first electrode and the second electrode contain ITO.

16. A display device comprising:
a light emitting layer provided between a first electrode and a second electrode;
wherein the light emitting layer emits light to a first display surface through the first electrode, and to a second display surface though the second electrode,
wherein the first and the second display surfaces are provided with a first circularly polarizing plate and a second circularly polarizing plate, respectively, and
wherein the first circularly polarizing plate and the second circularly polarizing plate are arranged as crossed nicols.

17. A display device according to claim 16,
wherein the first circularly polarizing plate has a first quarter-wave plate and a first half-wave plate, and the second circularly polarizing plate has second quarter-wave plate and a second half-wave plate,
wherein an absorption axis of a first polarizing plate and a slow axis of the first half-wave plate included in the first the circularly polarizing plate are at 17.5°,
wherein an absorption axis of the first polarizing plate and a slow axis of the first quarter-wave plate are at 80°,
wherein an absorption axis of a second polarizing plate and a slow axis of the second half-wave plate included in the circularly polarizing plate are at 17.5°,
wherein an absorption axis of the second polarizing plate and a slow axis of the second quarter-wave plate are at 80°, and
wherein an absorption axis of the first polarizing plate and an absorption axis of the second polarizing plate, and a slow axis of the first quarter-wave plate and a slow axis of the second quarter-wave plate are respectively parallel to each other.

18. A display device according to claim 17, wherein the first electrode and the second electrode contain ITO.

19. A display device according to claim 16, wherein the first electrode and the second electrode contain ITO.

20. A display device comprising:
a light emitting layer provided between a first electrode and a second electrode;
wherein the light emitting layer emits light to a first area only through the first electrode, and to a second area only through the second electrode, and
wherein the first and the second areas are respectively provided with a first circularly polarizing plate and a second circularly polarizing plate.

21. A display device according to claim 20, wherein the first circularly polarizing plate and the second circularly polarizing plate respectively have quarter-wave plates.

22. A display device according to claim 20, wherein an opaque film is provided over a second electrode in the second area.

23. A display device according to claim 20, wherein the first electrode and the second electrode contain ITO.

24. A display device comprising:
a light emitting layer provided between a first electrode and a second electrode;
wherein the light emitting layer emits light to a first area only though the first electrode, and to a second area only through the second electrode,
wherein the first and the second areas are respectively provided with a first circularly polarizing plate and a second circularly polarizing plate, and
wherein a first polarizing plate included in the first circularly polarizing plate and a second polarizing plate included in the second circularly polarizing plate are arranged as parallel nicols.

25. A display device according to claim 24, wherein the first circularly polarizing plate and the second circularly polarizing plate respectively have quarter-wave plates.

26. A display device according to claim 24, wherein an opaque film is provided over a second electrode in the second area.

27. A display device according to claim 24, wherein the first electrode and the second electrode contain ITO.

28. A display device comprising:
a light emitting layer provided between a first electrode and a second electrode;

wherein the light emitting layer emits light to a first area only through the first electrode, and to a second area only through the second electrode, wherein the first and the second areas are respectively provided with a first circularly polarizing plate and a second circularly polarizing plate, wherein a first polarizing plate included in the first circularly polarizing plate and a second polarizing plate included in the second circularly polarizing plate are arranged as parallel nicols, and wherein angular deviation from the parallel nicols is ±45° or less.

29. A display device according to claim 28, wherein the first circularly polarizing plate and the second circularly polarizing plate respectively have quarter-wave plates.

30. A display device according to claim 28, wherein an opaque film is provided over a second electrode in the second area.

31. A display device according to claim 28, wherein the angular deviation is ±30° or less.

32. A display device according to claim 28, wherein the angular deviation is ±10° or less.

33. A display device according to claim 28, wherein the angular deviation is ±5° or less.

34. A display device according to claim 28, wherein the first electrode and the second electrode contain ITO.

35. A display device comprising:

a light emitting layer provided between a first electrode and a second electrode;

wherein the light emitting layer emits light to a first area only through the first electrode, and to a second area only through the second electrode, wherein the first and the second areas are respectively provided with a first circularly polarizing plate and a second circularly polarizing plate, and wherein an axis of a first polarizing plate included in the first circularly polarizing plate and an axis of a second polarizing plate included in the second circularly polarizing plate are parallel to each other.

36. A display device according to claim 35, wherein the first circularly polarizing plate and the second circularly polarizing plate respectively have quarter-wave plates.

37. A display device according to claim 35, wherein an opaque film is provided over a second electrode in the second area.

38. A display device according to claim 35, wherein the first electrode and the second electrode contain ITO.

39. A display device comprising:

a light emitting layer provided between a first electrode and a second electrode;

wherein the light emitting layer emits light to a first area only through the first electrode, and to a second area only through the second electrode, wherein the first and the second areas are respectively provided with a first circularly polarizing plate and a second circularly polarizing plate, wherein an axis of a first polarizing plate included in the first circularly polarizing plate and an axis of a second polarizing plate included in the second circularly polarizing plate are parallel to each other, and wherein angular deviation from the parallelism is ±45° or less.

40. A display device according to claim 39, wherein the first circularly polarizing plate and the second circularly polarizing plate respectively have quarter-wave plates.

41. A display device according to claim 39, wherein an opaque film is provided over a second electrode in the second area.

42. A display device according to claim 39, wherein the angular deviation is 30° or less.

43. A display device according to claim 39, wherein the angular deviation is ±10° or less.

44. A display device according to claim 39, wherein the angular deviation is ±5° or less.

* * * * *